United States Patent
Wojcik et al.

(10) Patent No.: US 10,931,081 B2
(45) Date of Patent: Feb. 23, 2021

(54) METHOD OF PRODUCING AN OPTOELECTRONIC LIGHTING DEVICE AND OPTOELECTRONIC LIGHTING DEVICE

(71) Applicant: OSRAM OLED GmbH, Regensburg (DE)

(72) Inventors: Andreas Wojcik, Regensburg (DE); Tobias Gebuhr, Regensburg (DE); Markus Pindl, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/074,925

(22) PCT Filed: Feb. 3, 2017

(86) PCT No.: PCT/EP2017/052427
§ 371 (c)(1),
(2) Date: Aug. 2, 2018

(87) PCT Pub. No.: WO2017/134244
PCT Pub. Date: Aug. 10, 2017

(65) Prior Publication Data
US 2019/0036299 A1    Jan. 31, 2019

(30) Foreign Application Priority Data
Feb. 4, 2016    (DE) ..................... 10 2016 101 942.9

(51) Int. Cl.
*H01L 21/70* (2006.01)
*H01S 5/02* (2006.01)
*H01S 5/022* (2021.01)

(52) U.S. Cl.
CPC .......... *H01S 5/02296* (2013.01); *H01L 21/70* (2013.01); *H01S 5/0202* (2013.01); *H01S 5/02256* (2013.01); *H01S 5/02288* (2013.01)

(58) Field of Classification Search
CPC ............. H01S 5/02296; H01S 5/02288; H01S 5/02256; H01S 5/0202; H01S 5/022; H01L 21/70
See application file for complete search history.

(56) References Cited

U.S. PATENT DOCUMENTS 5,177,753 A    1/1993    Tanaka
5,875,205 A    2/1999    Spaeth et al.
(Continued)

FOREIGN PATENT DOCUMENTS

CN    1833308 A    9/2006
CN    101128943 A    2/2008
(Continued)

OTHER PUBLICATIONS

Office Action dated Sep. 2, 2019, of counterpart Chinese Application No. 201780009786.5, along with an English translation.
(Continued)

*Primary Examiner* — Yuanda Zhang
(74) *Attorney, Agent, or Firm* — DLA Piper LLP (US)

(57) ABSTRACT

A method of producing an optoelectronic lighting device includes providing a laser chip carrier on which two edge emitting laser chips, arranging a carrier including two optical elements onto the laser chip carrier, forming a respective optical connection by an optical material between a respective laser facet and a respective optical element, singulating the two laser chips by dividing the laser chip carrier between the two laser chips to form two mutually divided laser chip carrier parts, wherein the dividing includes dividing the carrier between the two optical elements to form two mutu-
(Continued)

ally divided carrier parts each including one of the two optical elements, such that two singulated laser chips arranged on the respective divided laser chip carrier part are formed, the respective laser facets of which are optically connected to the respective optical element of the respective carrier part by the optical material.

9 Claims, 13 Drawing Sheets

(56) References Cited

U.S. PATENT DOCUMENTS

| | | | |
|---|---|---|---|
| 6,345,903 | B1 | 2/2002 | Koike et al. |
| 7,095,763 | B2 | 8/2006 | Schuda |
| 7,208,337 | B2* | 4/2007 | Eisert ............... H01L 33/20 257/E33.012 |
| 7,772,085 | B2 | 8/2010 | Fratti et al. |
| 7,995,633 | B2* | 8/2011 | Dachs ............... H01S 5/0201 372/43.01 |
| 8,610,148 | B2 | 12/2013 | Nomaguchi |
| 8,976,829 | B2 | 3/2015 | Koenig et al. |
| 2002/0003819 | A1 | 1/2002 | Kimura et al. |
| 2003/0007257 | A1 | 1/2003 | Bell, Jr. et al. |
| 2003/0128552 | A1 | 7/2003 | Takagi et al. |
| 2004/0086010 | A1 | 5/2004 | Kurihara et al. |
| 2004/0086011 | A1 | 5/2004 | Bhandarkar |
| 2006/0065905 | A1* | 3/2006 | Eisert ............... H01L 33/20 257/95 |
| 2006/0203860 | A1 | 9/2006 | Inoue et al. |
| 2007/0178629 | A1 | 8/2007 | Ogawa et al. |
| 2008/0224161 | A1 | 9/2008 | Takada |
| 2009/0275159 | A1 | 11/2009 | Tanisaka |
| 2010/0158062 | A1 | 6/2010 | Miao et al. |
| 2010/0213487 | A1 | 8/2010 | Kuo et al. |
| 2013/0154130 | A1 | 6/2013 | Peil et al. |
| 2013/0156059 | A1* | 6/2013 | Behfar ............... H01S 5/20 372/45.01 |
| 2014/0240952 | A1 | 8/2014 | Nakanishi et al. |
| 2015/0244148 | A1 | 8/2015 | Schwarz |
| 2016/0190770 | A1 | 6/2016 | Eckert |
| 2016/0211644 | A1* | 7/2016 | Kleinfeld ............... H01S 5/0042 |

FOREIGN PATENT DOCUMENTS

| | | |
|---|---|---|
| CN | 102308239 A | 1/2012 |
| CN | 103190205 A | 7/2013 |
| DE | 695 00 600 T2 | 4/1998 |
| DE | 10 2010 023 815 A1 | 12/2011 |
| DE | 10 2013 205 594 A1 | 10/2014 |
| DE | 10 2013 216 525 A1 | 2/2015 |
| JP | S55-3668 | 1/1980 |
| JP | H04-14888 A | 1/1992 |
| JP | H04-48674 A | 2/1992 |
| JP | H05-315651 A | 11/1993 |
| JP | H09-321384 A | 12/1997 |
| JP | 2001057444 A | 2/2001 |
| JP | 2001-168399 A | 6/2001 |
| JP | 2007-59692 A | 3/2007 |
| JP | 2011-3889 A | 1/2011 |
| JP | 2011-77456 A | 4/2011 |
| JP | 2011-119699 A | 6/2011 |
| JP | 2012-178434 A | 9/2012 |
| JP | 2012-212734 A | 11/2012 |
| JP | 2015-510277 | 4/2015 |
| WO | 2007/022334 A2 | 2/2007 |
| WO | 2010/088631 A2 | 8/2010 |
| WO | 2011/141421 A2 | 11/2011 |
| WO | 2013/130580 A2 | 9/2013 |

OTHER PUBLICATIONS

Notice of Reasons for Rejection dated Sep. 10, 2019, of counterpart Japanese Application No. 2018-540390, along with an English translation.

* cited by examiner

METHOD OF PRODUCING AN OPTOELECTRONIC LIGHTING DEVICE AND OPTOELECTRONIC LIGHTING DEVICE

TECHNICAL FIELD

This disclosure relates to a method of producing an optoelectronic lighting device and an optoelectronic lighting device.

BACKGROUND

It is known to arrange a plurality of edge emitting laser chips onto a laser chip carrier, pot the laser chips and singulate them after the potting process. By way of example, singulating comprises sawing apart the laser chip carrier. Coupling-out surfaces to couple out laser radiation form as a result of the singulating, wherein the coupling-out surfaces are formed by the potting compound. On account of the singulating, the coupling-out surfaces are generally not configured for efficient optical coupling-out.

It could therefore be helpful to provide an efficient concept to efficiently couple out laser radiation from a laser chip.

SUMMARY

We provide a method of producing an optoelectronic lighting device including providing a laser chip carrier on which two edge emitting laser chips each including a laser facet are arranged with their respective laser facet opposite one another, arranging a carrier including two optical elements situated opposite one another onto the laser chip carrier between the two laser facets such that after the arranging respectively one of the two optical elements faces one of the two laser facets, forming a respective optical connection by an optical material between a respective laser facet and a respective optical element, singulating the two laser chips by dividing the laser chip carrier between the two laser chips to form two mutually divided laser chip carrier parts, wherein the dividing includes dividing the carrier between the two optical elements to form two mutually divided carrier parts each including one of the two optical elements such that two singulated laser chips arranged on the respective divided laser chip carrier part are formed, the respective laser facets of which are optically connected to the respective optical element of the respective carrier part by the optical material.

We also provide an optoelectronic lighting device including a laser chip carrier on which an edge emitting laser chip including a laser facet is arranged, wherein an optical element is arranged on the laser chip carrier, and an optical connection is formed between the laser facet and the optical element by an optical material.

LIST OF REFERENCE SIGNS

Figure 1:
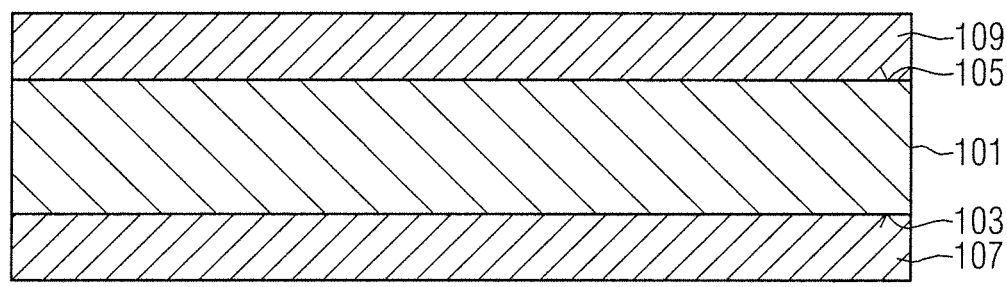
FIG. 1 shows a plan view of a first carrier.

101 Carrier
103 First side of the carrier
105 Second side of the carrier
107 First optical element
109 Second optical element
301 Carrier
401 Opening
501 Laser chip carrier
503 Top side
505 Electrical contact pad
507 Securing pad
509 Electrical contact pad
511 Securing pad
513 Laser chip
515 Laser chip
517 Laser facet
519 Laser facet
521 Bond wire
523 Emission direction of the laser chips
525 Sawing street
527, 529 Boundaries of the sawing street
601 Optical material
603 Optical connection
701 Potting material
801, 803 Laser chip carrier parts
805, 807 Singulated laser chips
809, 811 Carrier parts
901 Optoelectronic lighting device
903 Optoelectronic lighting device
1001 Side face of the potted potting material
1003 Coupling-out face of the optical element 109
1101 Optoelectronic lighting device
1103 Black potting material
1201 Providing
1203 Arranging
1205 Forming
1207 Singulating
1209 Forming
1301 Carrier
1303, 1305 Curvature
1307, 1309 Lens
1311, 1313 Lens curvature
1701 Lens
1703 Lens curvature
1901 Cylindrical lens
1903 Lens curvature
2101 Cylindrical lens
2103 Lens curvature

DETAILED DESCRIPTION

Our method produces an optoelectronic lighting device comprising the following steps:
  providing a laser chip carrier on which two edge emitting laser chips each comprising a laser facet are arranged with their respective laser facet opposite one another,
  arranging a carrier comprising two optical elements situated opposite one another onto the laser chip carrier between the two laser facets such that after the arranging respectively one of the two optical elements faces one of the two laser facets,
  forming a respective optical connection by an optical material between the respective laser facet and the respective optical element,
  singulating the two laser chips, by dividing the laser chip carrier between the two laser chips to form two mutually divided laser chip carrier parts, wherein the dividing comprises dividing the carrier between the two optical elements to form two mutually divided carrier parts each comprising one of the two optical elements,
  such that two singulated laser chips arranged on the respective divided laser chip carrier part are formed, the respective laser facets of which optically connect to the respective optical element of the respective carrier part by the optical material.

Our optoelectronic lighting device comprises:
  a laser chip carrier,
  on which an edge emitting laser chip comprising a laser facet is arranged,
  wherein an optical element is arranged on the laser chip carrier, and
  an optical connection is formed between the laser facet and the optical element by an optical material.

We form an optical connection between the laser facet and an optical element by an optical material. The optical element thus forms a defined coupling-out face to efficiently couple out the laser radiation emitted by the laser chip. This affords the technical advantage, in particular, that efficient coupling-out of the laser radiation from the laser chip may be made possible.

An edge emitting laser chip denotes in particular a laser chip that emits laser radiation via a side face, the laser facet.

Providing a carrier comprising a respective optical element at two opposite sides affords the technical advantage, in particular, that two laser chips may be provided with a dedicated optical element in a common step. This advantageously reduces mounting and production time for the optoelectronic lighting device.

The fact that the optical connection is formed by an optical material affords the technical advantage, in particular, that an additional jump in refractive index on account of an air gap or absorption of optical power in a nontransparent material is prevented or avoided.

An optical connection thus denotes in particular a connection that guides the emitted laser radiation to the optical element preferably substantially without losses. In particular, an optical connection denotes a connection that guides the emitted laser radiation to the optical element substantially without a deflection, for example, by scattering and/or reflection.

Singulating the two laser chips by dividing the laser chip carrier means that an indirect connection of the two laser chips formed by the laser chip carrier is separated. That is to say that before the singulating by separating the two laser chips are indirectly connected by the laser chip carrier. Before singulating, the two laser chips may not, for example, be moved independently of one another. After singulating, the indirect connection is released such that two mutually independent laser chips are formed. The laser chip carrier parts may also be referred to as singulated laser components. That is to say that two singulated laser components each comprising one of the laser chips are formed after singulating.

That is to say, in particular, that the laser chips are laser chips that have already been singulated before being arranged onto the laser chip carrier. By way of example, the laser chips are or have been formed or produced on a common substrate, for example, a wafer. After production, the laser chips are singulated by the substrate, for example, the wafer being separated, for example, sawn apart such that singulated laser chips are formed. The singulated laser chips are subsequently arranged onto the laser chip carrier. As a result of this arranging, however, an indirect connection is formed between the originally singulated laser chips by the laser chip carriers, wherein the indirect connection is separated again, however, in the further method, as described above and below.

The optical material may comprise an epoxy resin and/or a silicone.

The optical material may comprise a transmission of at least 90%, in particular 95%, in particular 99%, of the wavelength of the emitted laser radiation.

Furthermore, providing an optical element affords the technical advantage that a path length for moisture from outside the lighting device to the laser facet is increased. This affords the technical advantage, in particular, that moisture damage to the laser facet may be reduced or avoided. Consequently, the optoelectronic lighting device may be used even in harsh ambient conditions, for example, moist ambient conditions. In particular, this affords the technical advantage that a lifetime for the optoelectronic lighting device is increased.

The carrier may be removed after singulating.

In a carrier that is not removed and formed from a soluble material, an undefined dissolution of the carrier may occur in the application or in use, for example, on account of moisture or chemicals. That area of the optical element through which the laser beam is coupled out may be contaminated as a result. The coupling-out efficiency is thus reduced (by absorption or scattering). These disadvantages may be avoided on account of the removing.

The carrier may be formed from a soluble material, wherein the removing comprises dissolving the material. This affords the technical advantage, in particular, that the carrier may be efficiently removed after singulating.

The carrier may be formed from a water-soluble PVA resist or from a water-soluble SU8 resist. SU-8 denotes a photoresist. PVA denotes polyvinyl alcohol (water-soluble resist used for photolithography). PVA is therefore not polyvinyl acetate.

The carrier may be formed as an adhesive film. The adhesive film may be removed after singulating. Providing such a film affords the technical advantage, in particular, that the carrier may be efficiently removed after singulating.

The carrier may be formed as a frame enclosing an opening, wherein the two optical elements are each arranged on the carrier in a manner covering the opening.

This affords the technical advantage, in particular, that a stable carrier for the two optical elements is formed. In particular, this affords the technical advantage that an additional mechanical mount for the optical elements is provided after singulating: the two carrier parts remaining at the laser chip carrier part.

The carrier may be formed as a tube, wherein the two optical elements are each arranged as a cover at a front side and at a rear side of the tube.

The optical element may be a sheet, in particular a glass sheet.

The optical element may be formed from glass.

To form the respective optical connection, the two laser chips and the carrier with the two optical elements are potted by an optical potting material such that the respective optical connection is formed by the optical potting material as optical material.

This affords the technical advantage, in particular, that the optical connection may be formed efficiently. That is to say that the optical connection is formed in the context of the potting process or potting method. Consequently, the potting by the optical potting material first brings about potting of the laser chips and the carrier with the two optical elements. The potting secondly has the effect that the respective optical connections are formed.

The optical potting material comprises in particular a transmission of 90%, in particular 95%, in particular 99%, at a wavelength of the emitted laser radiation.

After forming the optical connection and before singulating the two laser chips, the two laser chips, the carrier with the two optical elements and the respective optical connections are potted by a potting material.

This affords the technical advantage, in particular, that the optical connection may be formed efficiently independently of potting. This makes it possible, for example, to use for the potting a potting material which has no special optical properties, that is to say in particular is not configured for an efficient transmission of the emitted laser radiation. By way of example, the potting material may be a nontransparent potting material. On account of the optical connection already present, this is noncritical for the coupling-out of the laser radiation. In particular, the potting material is a black potting material.

The potting may comprise molding. The potting may comprise injection molding, for example. The potting comprises, for example, foil assisted injection molding, also referred to as "foil assisted molding (FAM)."

Arranging the carrier onto the laser chip carrier may comprise adhesively bonding the carrier onto the laser chip carrier by an adhesive.

This affords the technical advantage, in particular, that arranging the carrier onto the laser chip carrier may be carried out efficiently. In particular, this advantageously makes it possible to prevent the carrier from being displaced during steps succeeding the arranging.

The adhesive comprises a silicone, for example.

The two optical elements may each be an element selected from the following group of optical elements: spherical lens, aspherical lens, collimator lens, in particular collimator lens to collimate laser radiation emitted by the laser chip and polarized in the direction of a fast axis of the laser chip or in the direction of a slow axis of the laser chip. The collimator lens is a cylindrical lens, for example. The cylindrical lens collimates in particular the laser radiation polarized in the direction of the fast axis. The collimator lens, in particular the cylindrical lens, is thus in particular an FAC lens (FAC=Fast Axis Collimation).

The optical elements mentioned above affords the technical advantage, in particular, that an efficient optical imaging of the emitted laser radiation may be achieved. This advantageously makes it possible, for example, by a spherical and/or respectively aspherical lens, to efficiently coordinate both the laser radiation polarized in the direction of the fast axis of the laser chip and the laser radiation polarized in the direction of the slow axes of the laser chip. Providing a collimator lens affords the technical advantage, in particular, that the collimator lens is efficiently geared or configured to coordinate only one of the two polarized laser radiations. The collimator lens is a cylindrical lens, for example.

The carrier may comprise two curvatures that respectively accommodate a lens curvature of the respective lens.

This affords the technical advantage, in particular, that the lenses are accommodated efficiently at the carrier. In particular, providing such curvatures affords the technical advantage that a component thickness may be efficiently reduced.

The optoelectronic lighting device may have been or may be produced by the method of producing an optoelectronic lighting device.

Technical functionalities of the optoelectronic lighting device are evident analogously from corresponding technical functionalities of the method of producing an optoelectronic lighting device, and vice-versa. That is to say that device features are evident from corresponding method features, and vice-versa.

The optical element may be arranged on the laser chip carrier in a manner free of a carrier. Therefore, the optical element is in particular not carried or held by a carrier.

The fact that the optical element is free of a carrier on the laser chip carrier means, for example, that the carrier was removed from the optical element after the singulating.

The optical element may be encompassed by a carrier arranged on the laser chip carrier.

Therefore, for example, the carrier may not be removed from the optical element after singulating.

The carrier may be formed as a frame enclosing an opening, wherein the optical element is arranged on the carrier in a manner covering the opening.

The carrier may be adhesively bonded on the laser chip carrier by an adhesive.

The laser chip and the optical element may be potted by an optical potting material such that the optical connection is formed by the optical potting material as optical material.

The laser chip and the carrier with the optical element to be potted by an optical potting material such that the optical connection is formed by the optical potting material as optical material.

The laser chip, the optical element and the optical connection may be potted by a potting material.

The laser chip, the carrier with the optical element and the optical connection may be potted by a potting material.

The optical element may be an element selected from the following group of optical elements: spherical lens, aspherical lens, collimator lens, in particular collimator lens for collimating a laser radiation emitted by the laser chip and polarized in the direction of a fast axis of the laser chip or in the direction of a slow axis of the laser chip. The collimator lens is a cylindrical lens, for example. The cylindrical lens collimates in particular the laser radiation polarized in the direction of the fast axis. The collimator lens, in particular the cylindrical lens, is thus in particular an FAC lens (FAC=Fast Axis Collimation).

The carrier may comprise a curvature that accommodates a lens curvature of the lens.

The singulating may comprise sawing. The singulating may be carried out by a laser.

The laser chip carrier may be formed as a printed circuit board. A printed circuit board may also be referred to as a circuit board. A printed circuit board is designated in English as "(PCB)." Such a printed circuit board affords the technical advantage, in particular, that an efficient electrical contacting of the laser chips may be brought about.

The laser chip carrier may be formed as a ceramic substrate provided with electrical contactings.

The laser chip carrier may be formed as a structured metal carrier, which may be referred to, for example, as a leadframe.

The laser chip carrier may be formed as a panel, for example, a leadframe panel or a ceramic panel. The wording "panel" is intended to clarify, in particular, that the laser chip carrier is in particular not a growth substrate for an epitaxial structure of the laser chips. The laser chip carrier is thus in particular not a wafer.

The above-described properties, features and advantages and the way in which they are achieved will become clearer and more clearly understood in association with the following description of examples explained in greater detail in association with the drawings.

Hereinafter, identical reference signs may be used for identical features.

FIG. 1 shows a plan view of a carrier 101.

The carrier 101 comprises a first side 103. The carrier 101 comprises a second side 105. The first side 103 is situated opposite the second side 105.

A first optical element 107 is arranged at the first side 103 of the carrier 101. The first optical element 107 is a glass sheet, for example.

A second optical element 109 is arranged at the second side 105. The second optical element 109 is a glass sheet, for example.

Consequently, the carrier 101 comprises two opposite optical elements 107, 109.

A geometric shape of the carrier 101 corresponds, for example, to a respective geometric shape of the two optical elements 107, 109 such that, for example, the optical elements 107, 109 extend flush with outer edges of the sides 103, 105.

Figure 2:
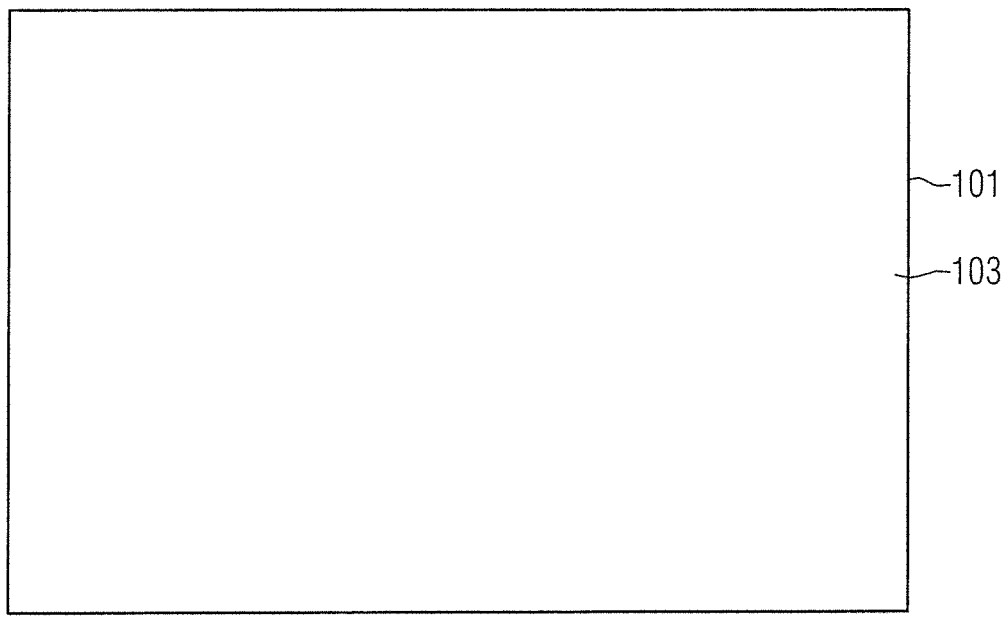
FIG. 2 shows a side view of the carrier from FIG. 1.

FIG. 2 shows a side view of the side 103 of the carrier 101 without the optical element 107. The carrier 101 comprises a parallelepipedal shape.

The carrier 101 is a film, for example.

The carrier 101 is formed, for example, from a soluble material or a soluble substance. Consequently, after a singulating step in a method of producing an optoelectronic lighting device, the carrier may be removed by the latter being dissolved.

By way of example, the carrier 101 is formed from a water-soluble material. By way of example, the carrier 101 is formed from a solvent-soluble material.

Figure 3:
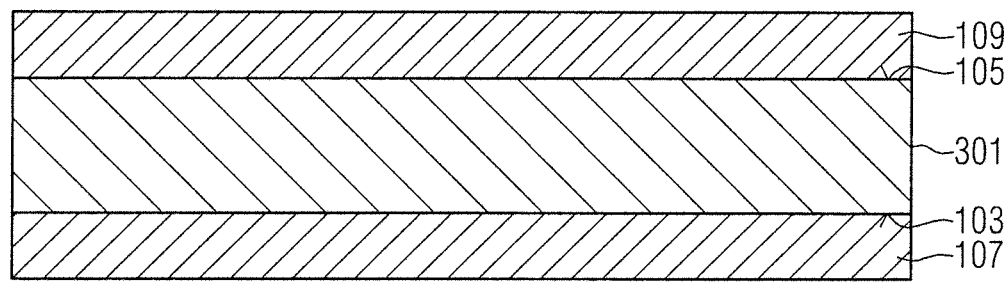
FIG. 3 shows a plan view of a second carrier.

FIG. 3 shows a second carrier 301 in a plan view.

Analogously to FIG. 1, two optical elements 107, 109 are arranged at a first side 103 and second side 105, respectively, of the carrier 301.

Figure 4:
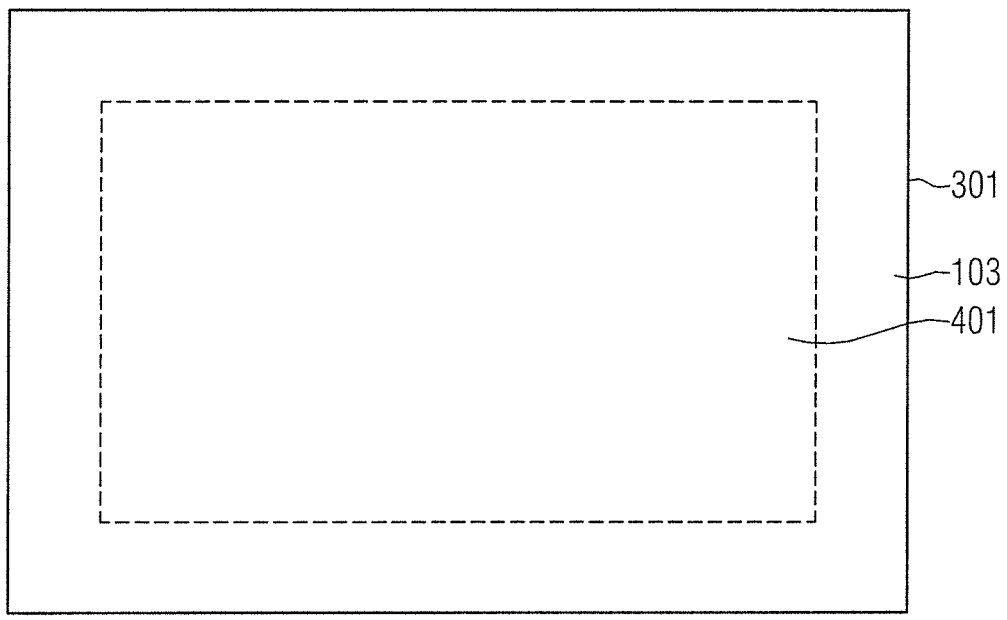
FIG. 4 shows a side view of the carrier from FIG. 3.

FIG. 4 shows a side view of the carrier 301 from FIG. 3 looking at the first side 103 with the optical element 107 removed.

The carrier 301 is formed as a quadrilateral frame enclosing an opening 401. By way of example, the opening 401 is formed by carrier material being stamped out from the carrier 301.

The opening 401 is covered from both sides, that is to say from the first side 103 and from the second side 105, with respectively one of the two optical elements 107, 109.

This example of a carrier, that is to say carrier 301, advantageously makes it possible that the divided carrier parts no longer need be removed after a singulating step. Consequently, the carrier parts may continue to remain at the laser chip carrier.

Figure 5:
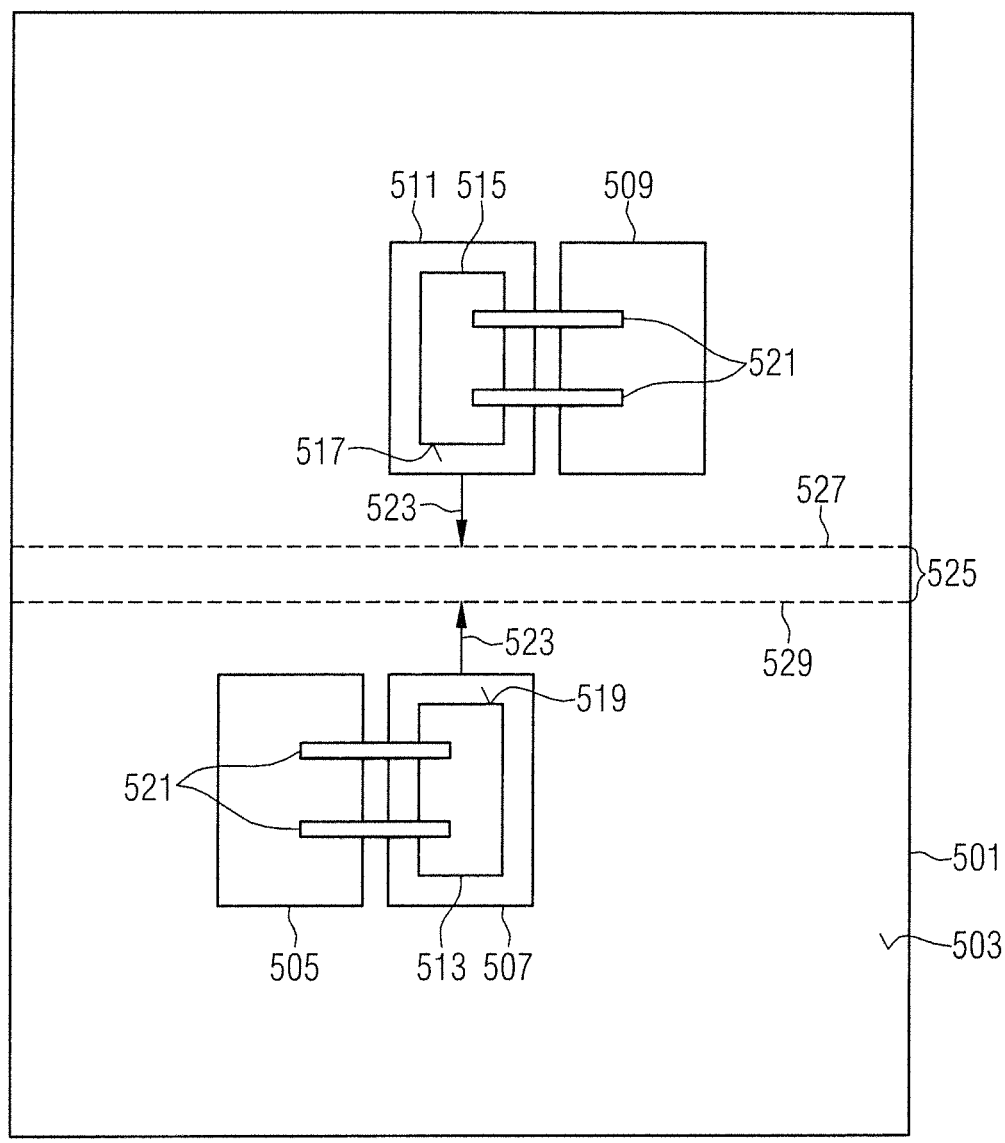
FIGS. 5 to 9 each show a point in time in a method of producing an optoelectronic lighting device.

FIG. 5 shows a first point in time in a method of producing an optoelectronic lighting device.

A laser chip carrier 501 is provided. The laser chip carrier 501 comprises a top side 503. An electrical contacting pad 505, a securing pad 507, an electrical contact pad 509 and a securing pad 511 are arranged on the top side 503. In this case, the two securing pads 507, 511 are arranged opposite one another.

A laser chip 513 is arranged or secured on the securing pad 507. A further laser chip 515 is arranged or secured on the securing pad 511.

The two securing pads 507, 511 are designated as "Die Attach Pad," but may also be referred to as "chip mounting pad."

The two laser chips 513, 515 are edge emitting laser chips. That is to say that the two laser chips 513, 515 emit laser radiation via a side face. More precisely, the two laser chips 513, 515 emit laser radiation via a laser facet 519 and laser facet 517, respectively.

That is to say that the edge emitting laser chip 513 comprises a laser facet 519 via which laser radiation may be coupled out from the laser chip 513.

The laser chip 515 comprises a laser facet 517 via which laser radiation may be coupled out.

An emission direction of the respective laser chips 513, 515 is symbolically identified by an arrow with the reference sign 523.

By virtue of the fact that the two securing pads 507, 511 are arranged opposite one another, the two laser chips 513, 515 are also arranged opposite one another on the laser chip carrier 501.

In this case, the two laser chips 513, 515 are arranged such that their respective laser facets 517, 519 are arranged opposite one another. That is to say that the laser facet 517 faces the laser facet 519, and vice-versa.

An electrical contacting of the respective laser chips 513, 515 is made possible via the electrical contact pads 505, 509. By way of example, two electrical connections 521 lead respectively from the corresponding electrical contact pad 505, 509 to the corresponding laser chip 513, 515. By way of example, the laser chips 513, 515 are electrically contacted by bond wires.

A curly bracket with the reference sign 525 shows a sawing street along which sawing is intended to be carried out at a later point in time in the method of producing an optoelectronic lighting device to singulate the two laser chips 513, 515. Two dashed lines 527, 529 are depicted symbolically, which are intended to represent a boundary of the sawing street 525.

That is to say, therefore, that sawing is carried out along the sawing street 525 to divide or saw up the laser chip carrier 501 into two parts.

Figure 6:
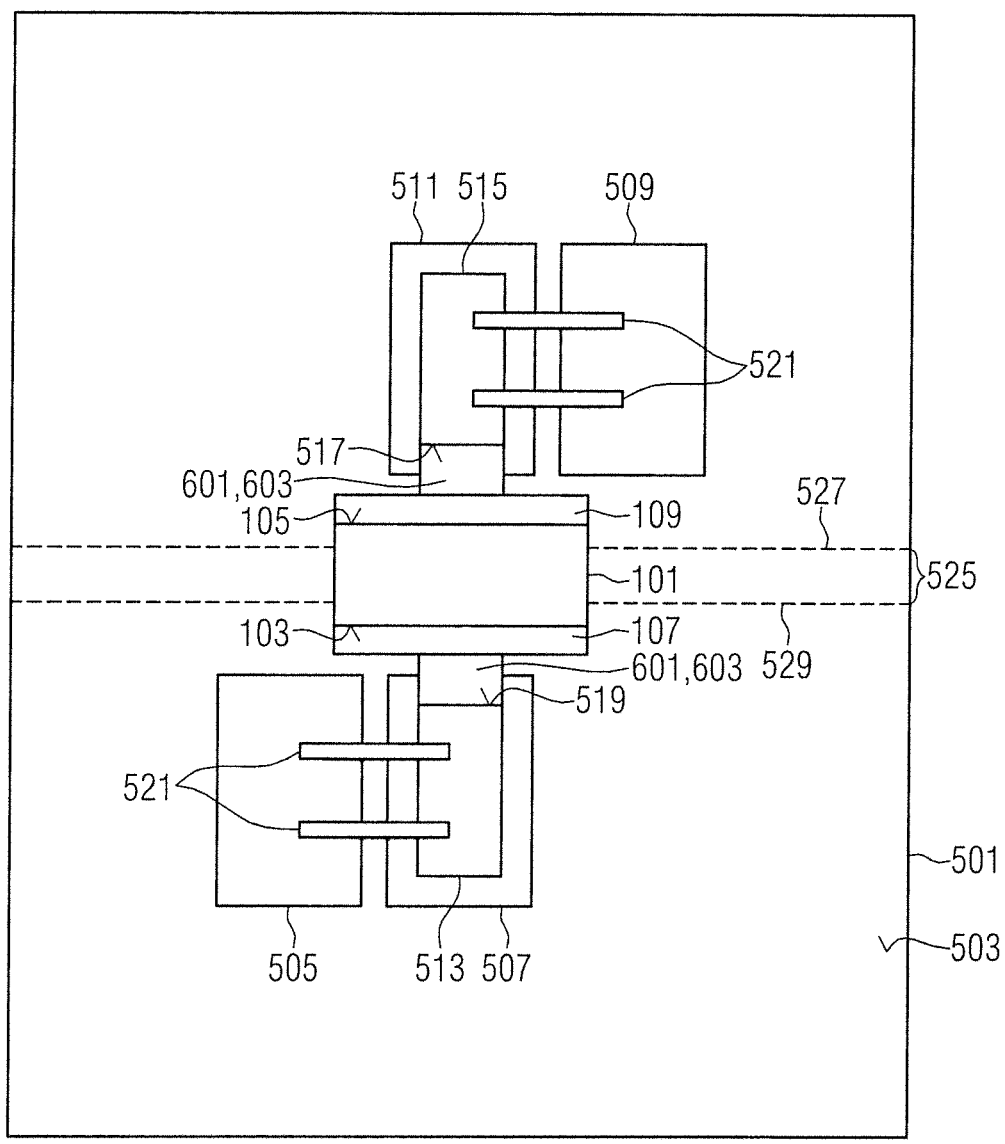

FIG. 6 shows a second point in time in the method of producing an optoelectronic lighting device, wherein the second point in time temporally succeeds the first point in time.

The carrier 101 from FIG. 1 is arranged onto the top side 503 of the laser chip carrier 501 between the two laser facets 517, 519. The carrier 101 is arranged such that after the arranging the optical element 107 faces the laser facet 519 and the optical element 109 faces the laser facet 517.

The carrier 101 is fixed on the top side 503 of the laser chip carrier 501, for example, by a silicone drop or an adhesive.

Furthermore, an optical material 601 is introduced between the laser facet 519 and the first optical element 107 to form an optical connection 603 between the laser facet 519 and the first optical element 107.

Furthermore, the optical material 601 is introduced between the laser facet 517 and the second optical element 109 to form an optical connection 603 between the laser facet 517 and the second optical element 109.

The adhesive and/or respectively the silicone drop and/or respectively the applied optical material 601 is cured.

Figure 7:
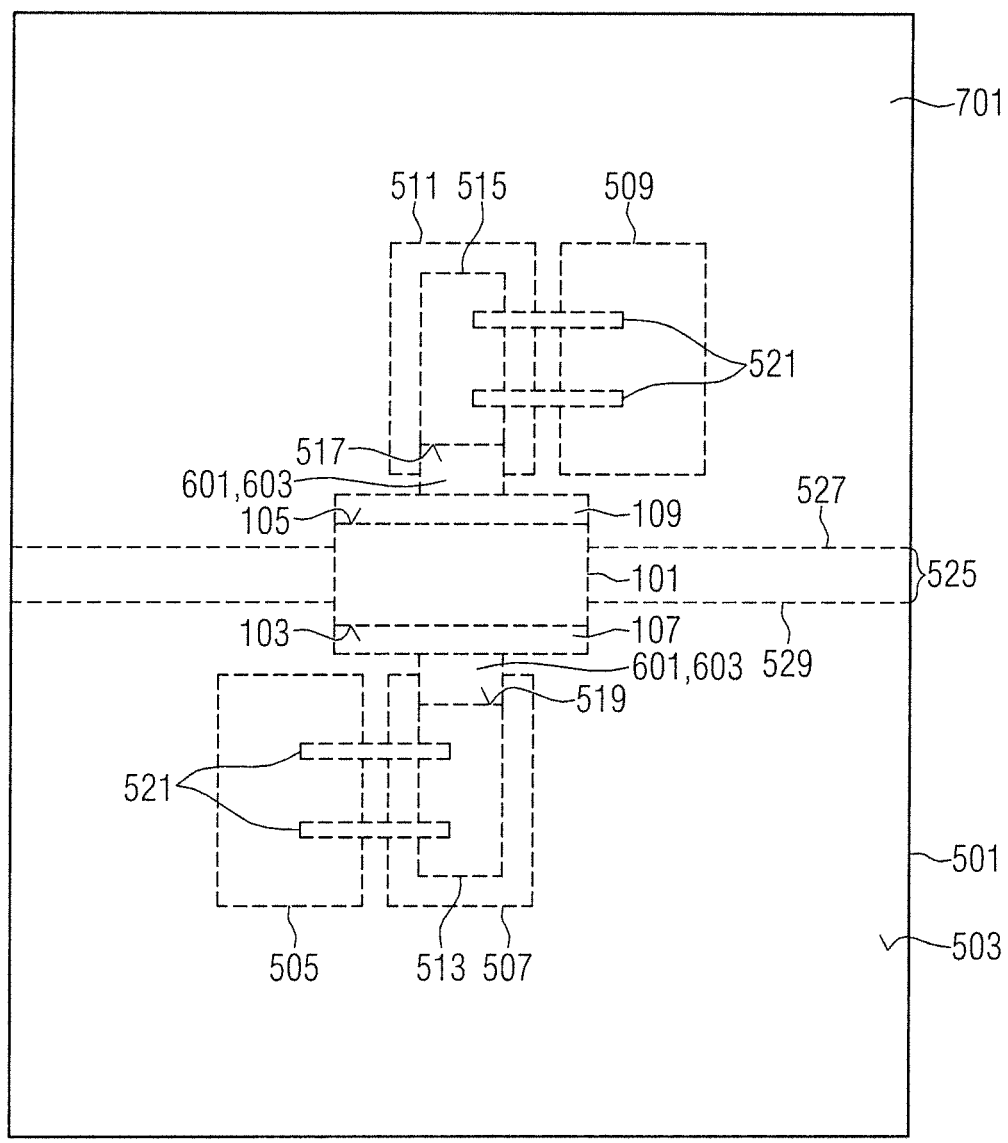

FIG. 7 shows a further step at a third point in time of the method of producing an optoelectronic lighting device, wherein the third point in time temporally succeeds the second point in time.

The individual elements arranged on the laser chip carrier 501 are potted by a potting material 701.

That is to say, therefore, that the top side 503 of the laser chip carrier 501, the electrical contact pads 505, 509, the securing pads 507, 511, the two laser chips 513, 515, the bond wires 521 and also the carrier 101 with the two optical elements 107, 109 are potted by the potting material 701.

In this case, the top side 503 of the laser chip carrier 501 is completely potted by the potting material 701.

The potting is so-called molding, for example. That is to say that the individual elements are molded in.

Figure 8:
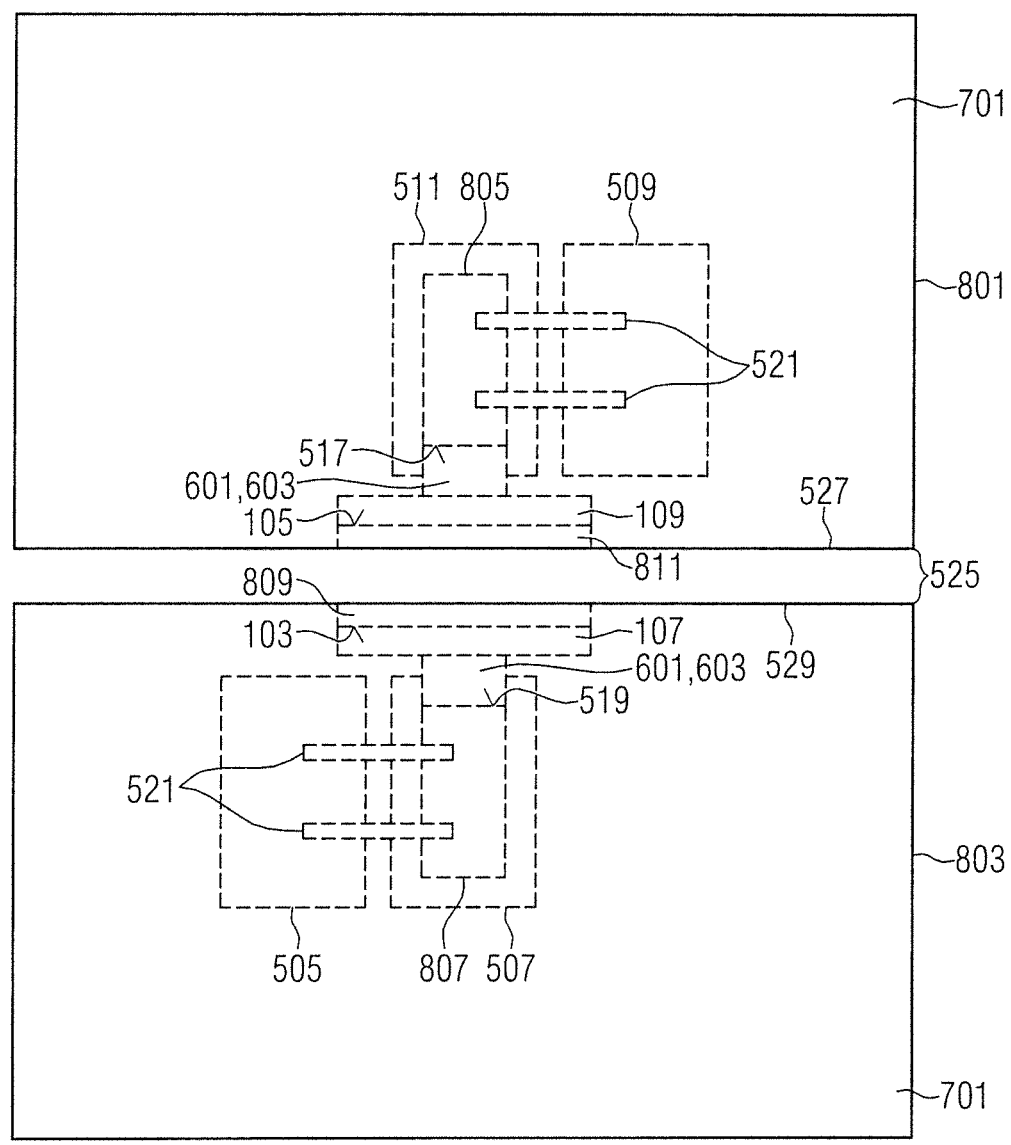

FIG. 8 shows a production step at a fourth point in time of the method of producing an optoelectronic lighting device, wherein the fourth point in time temporally succeeds the third point in time.

The two laser chips 513, 515 are singulated. For this purpose, the laser chip carrier 501 is divided, in particular sawn apart, along the sawing street 525.

Since the carrier 101 was arranged onto the sawing street 525, the carrier 101 is thus also sawn apart. In this case, however, the sawing is carried out between the two optical elements 107, 109 to not damage or destroy the two optical elements 107, 109 during singulating.

After singulating, that is to say after sawing apart, two laser chip carrier parts 801, 803 are thus formed. A respective singulated laser chip 805, 807 is arranged thereon. On account of the carrier 101 being sawn apart, two carrier parts 809, 811 are thus formed. In this case, the first optical element 107 is arranged at the carrier part 809. The second optical element 109 is arranged at the carrier part 811.

Figure 9:
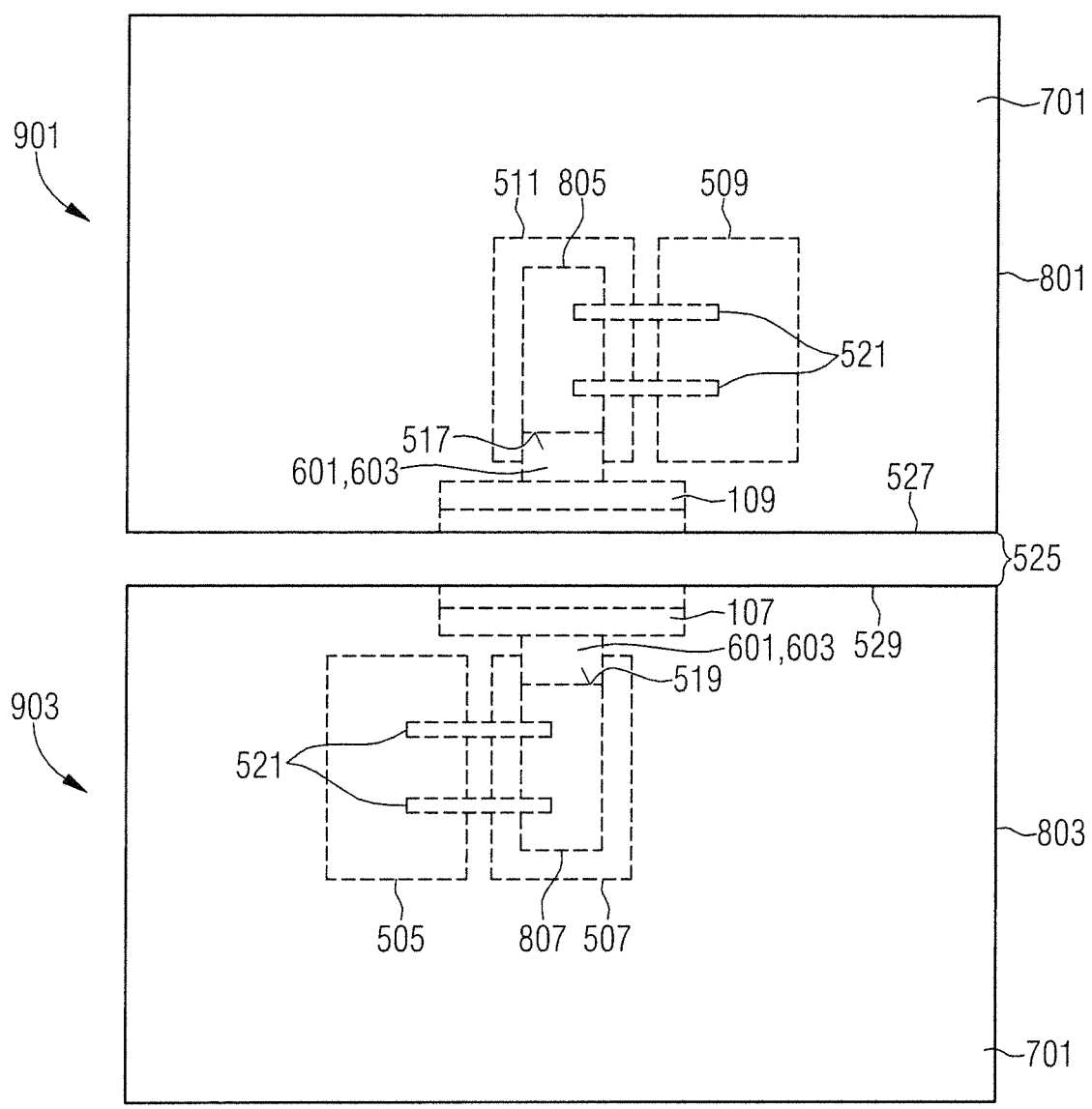

FIG. 9 shows a further production step in the method of producing an optoelectronic lighting device at a fifth point in time, wherein the fifth point in time temporally succeeds the fourth point in time.

The two carrier parts 809, 811 are removed. By way of example, the carrier parts 809, 811 are dissolved, provided that the carrier is formed from a soluble material. If the carrier 101 and thus the two carrier parts 809, 811 are formed as a film, then, for example, removed, for example, pulled off, the film from the corresponding optical elements 107, 109.

Consequently, two optoelectronic lighting devices 901, 903 are produced, each comprising a laser chip carrier, here the laser chip carrier parts 801, 803, on which respectively an edge emitting laser chip 513, 515 is arranged. Between a respective laser facet 517, 519 and an optical element 107, 109 an optical connection 603 is formed by an optical material 601.

Figure 10:
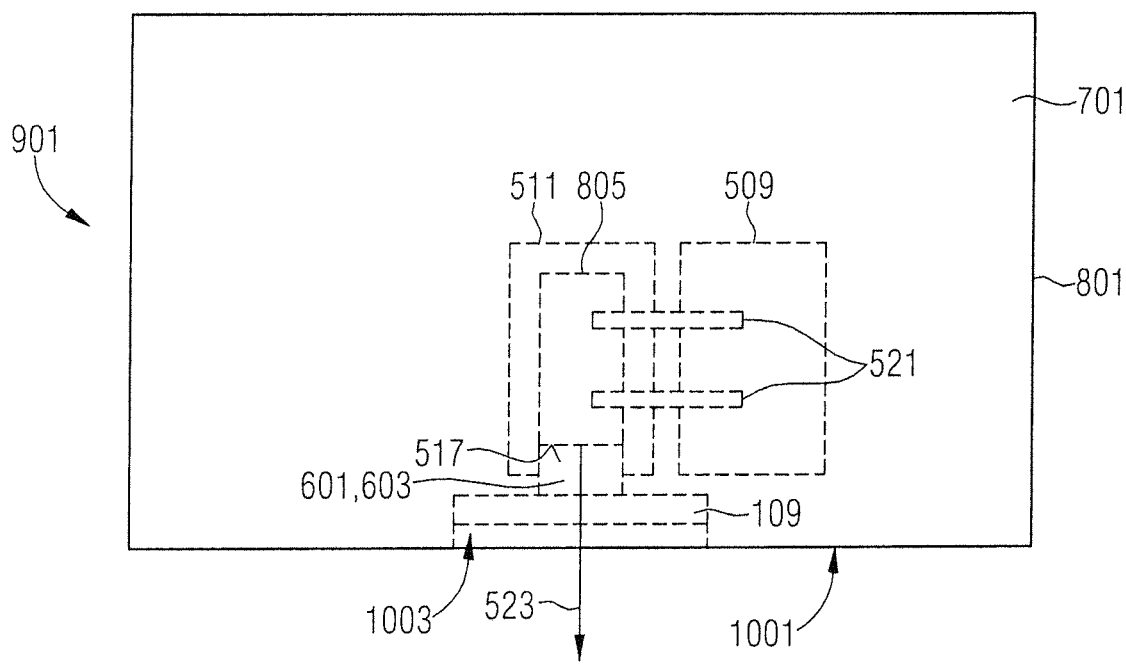
FIG. 10 shows an optoelectronic lighting device such as was produced in accordance with FIGS. 5 to 9.

FIG. 10 shows the optoelectronic lighting device 901 from FIG. 9.

The reference sign 1001 points at a side face of the potted potting material 701, the side face 1001 having arisen as a result of the singulating, in particular as a result of the sawing apart. On account of the singulating process, the side face 1001 comprises a certain roughness usually not suitable for coupling out laser radiation from a laser facet of an edge emitting laser chip.

However, since we place an optical element in front of the laser facet of a laser chip and optically connect the optical element to the laser facet by an optical material, a defined coupling-out face comprising defined optical properties is provided for the laser chip by the optical element.

For the optoelectronic lighting device 901, this is the coupling-out face 1003 of the second optical element 109. Since the optical element 109 is not damaged during the singulating process, the coupling-out face 1003 of the optical element 109 may be efficiently used to couple out the laser radiation. Consequently, a complex aftertreatment, for example, a mechanical or chemical aftertreatment, for example, polishing of a coupling-out face is no longer necessary. By way of example, a time expenditure for the production of an optoelectronic lighting device may be reduced as a result.

Figure 11:
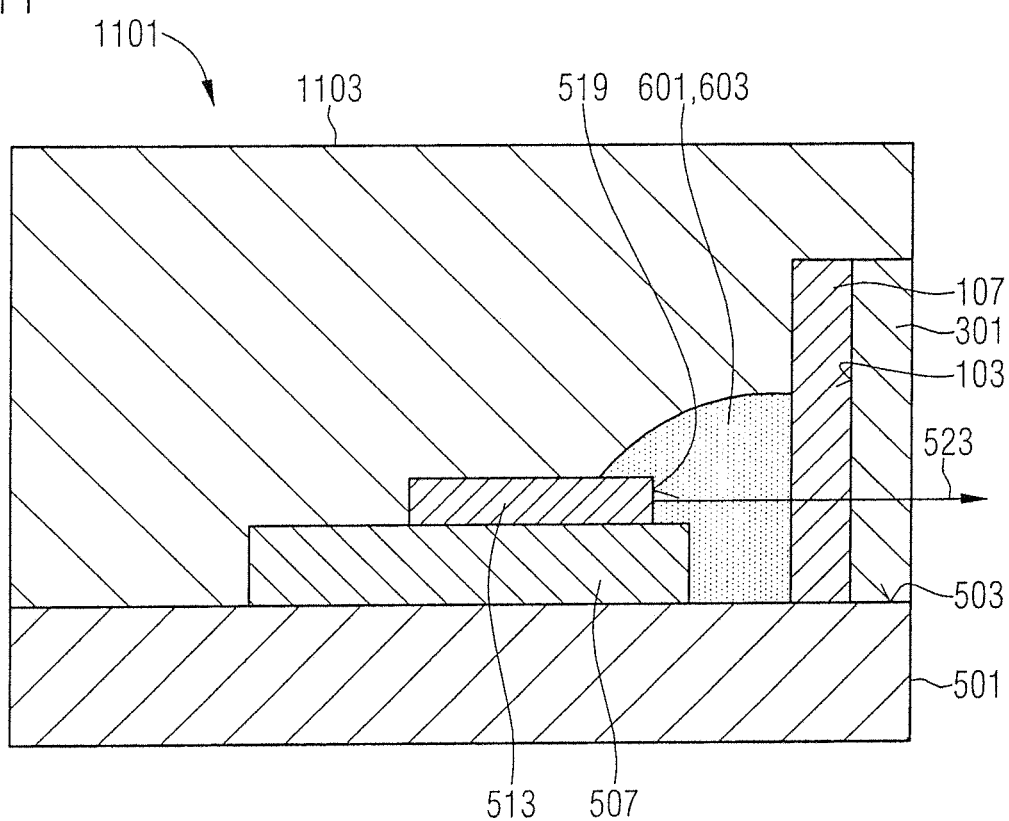
FIG. 11 shows a further optoelectronic lighting device.

FIG. 11 shows a further optoelectronic lighting device 1101 in a lateral sectional view.

Instead of the carrier 101, the carrier 301 from FIG. 3 has been used in the method of producing an optoelectronic lighting device. Consequently, the carrier 301 may remain at the laser chip carrier 501 and need not be removed from the latter.

FIG. 11 shows the optoelectronic lighting device 1101 after a singulating step. For the sake of simplicity, the same reference signs as for the non-singulated elements have been used for the singulated elements.

In the optoelectronic lighting device 1101, the individual elements arranged on the laser chip carrier 501 are potted by a black potting material 1103. Consequently, the optical connection 603 is thus also potted by the black potting material 1103. However, this potting does not disturb the optical connection between the laser facet 519 and the optical element 107.

Figure 12:
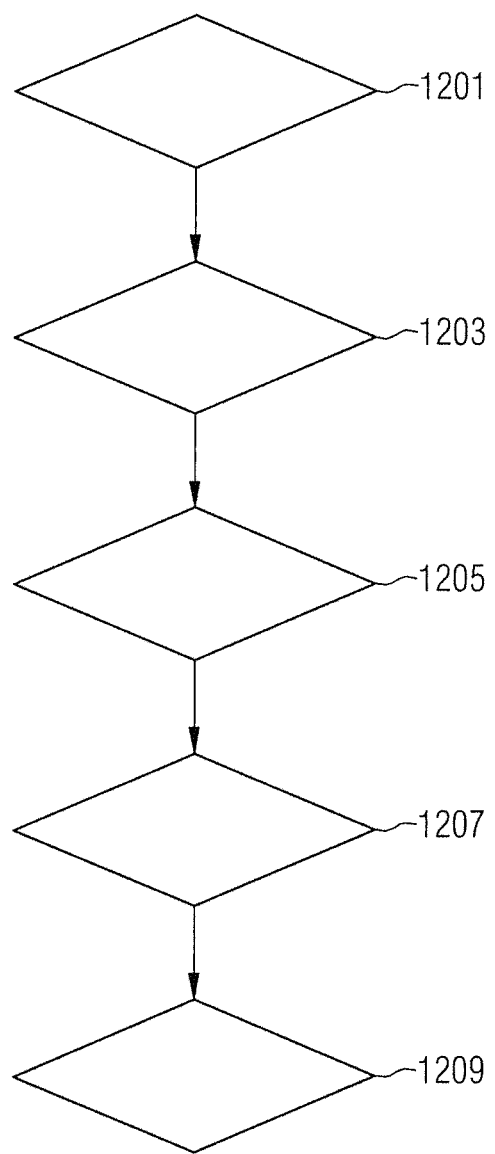
FIG. 12 shows a flow diagram of a method of producing an optoelectronic lighting device.

FIG. 12 shows a flow diagram of a method of producing an optoelectronic lighting device.

The method comprises the following steps:

providing 1201 a laser chip carrier on which two edge emitting laser chips each comprising a laser facet are arranged with their respective laser facet opposite one another, arranging 1203 a carrier comprising two optical elements situated opposite one another onto the laser chip carrier between the two laser facets such that after the arranging respectively one of the two optical elements faces one of the two laser facets, forming 1205 a respective optical connection by an optical material between the respective laser facet and the respective optical element, singulating 1207 the two laser chips, by dividing the laser chip carrier between the two laser chips to form two mutually divided laser chip carrier parts, wherein the dividing comprises dividing the carrier between the two optical elements to form two mutually divided carrier parts each comprising one of the two optical elements such that two singulated laser chips arranged on the respective divided laser chip carrier part are formed 1209, the respective laser facets of which optically connect to the respective optical element of the respective carrier part by the optical material.

Singulating comprises sawing apart, in particular sawing apart the laser chip carrier and sawing apart the carrier.

Figure 13:
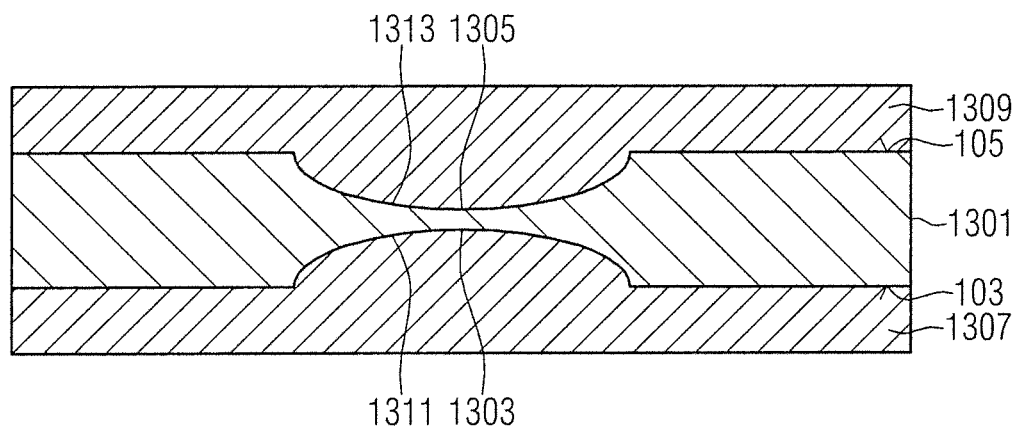
FIG. 13 shows a plan view of a third carrier.

FIG. 13 shows a plan view of a further carrier 1301.

The carrier 1301 comprises a first curvature 1303 at its first side 103. The carrier 1301 comprises a second curvature 1305 at its second side 105. The two sides 103, 105 are provided with a curvature 1303, 1305. A curvature 1303 is formed at the side 103. A curvature 1305 is also formed at the side 105.

A first lens 1307 is arranged at the first side 103. The lens 1307 comprises a lens curvature 1311 and the curvature 1303 of the first side 103 is dimensioned or formed such that the lens curvature 1311 of the first lens 1307 may be accommodated in the curvature 1303.

A second lens 1309 is arranged at the second side 105. The second lens 1309 comprises a lens curvature 1313. The curvature 1305 of the second lens 105 is dimensioned or formed such that the lens curvature 1313 may be accommodated in the curvature 1305.

Figure 14:
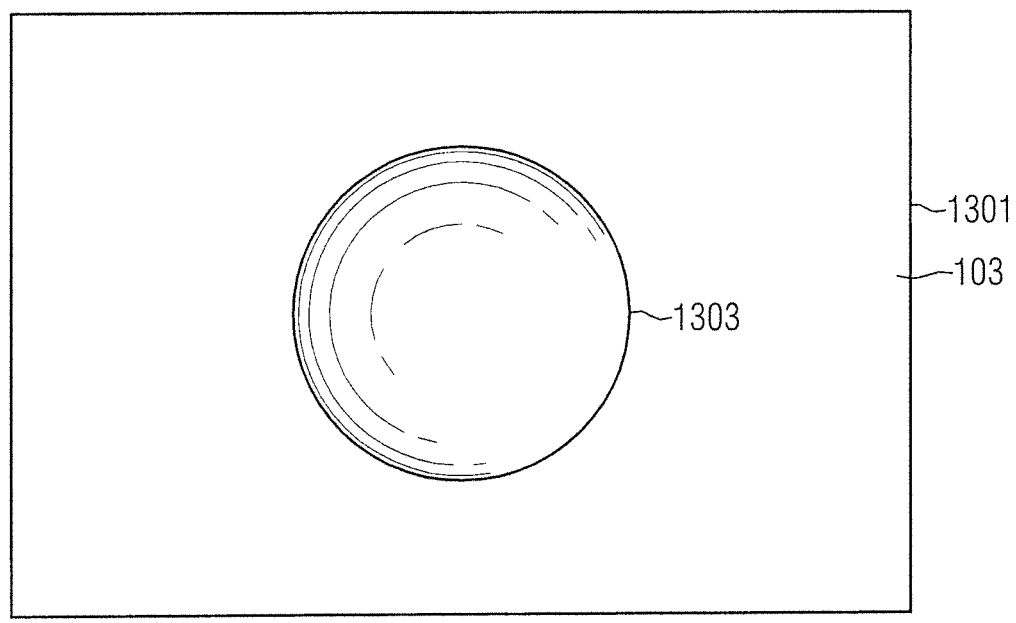
FIG. 14 shows a side view of the carrier from FIG. 13.

FIG. 14 shows a side view of the side 103 of the carrier 1301 from FIG. 13.

Figure 15:
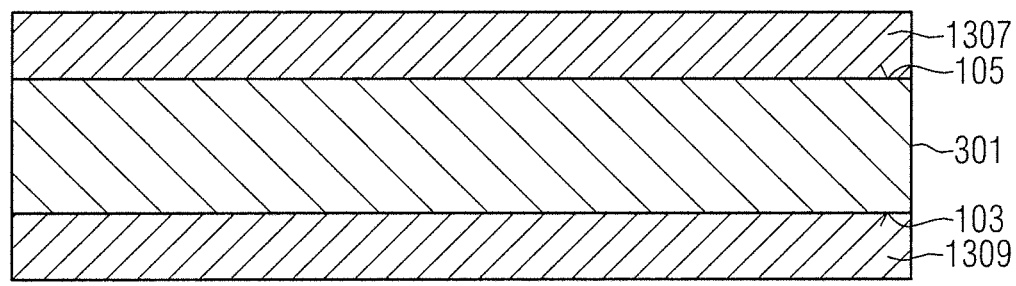
FIG. 15 shows a plan view of the carrier from FIG. 3 with different optical elements in comparison with FIGS. 3 and 4.
Figure 16:
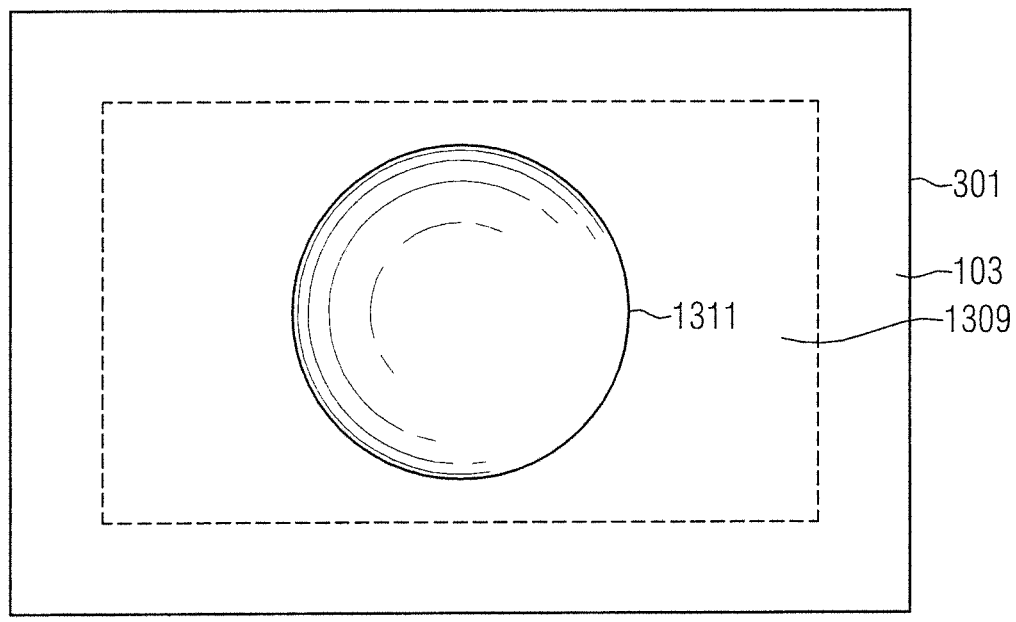
FIG. 16 shows a side view of the carrier from FIG. 15.

FIG. 15 shows a plan view of the carrier 301 from FIG. 3, wherein the two optical elements 107, 109 in accordance with FIG. 3 are not arranged on the corresponding sides 103, 105. Rather, the two lenses 1307, 1309 from FIG. 13 are arranged on the corresponding sides 103, 105.

By virtue of the fact that the carrier 301 comprises an opening 401, the corresponding lens curvature 1311, 1313 may be accommodated in the opening 401.

Figure 17:
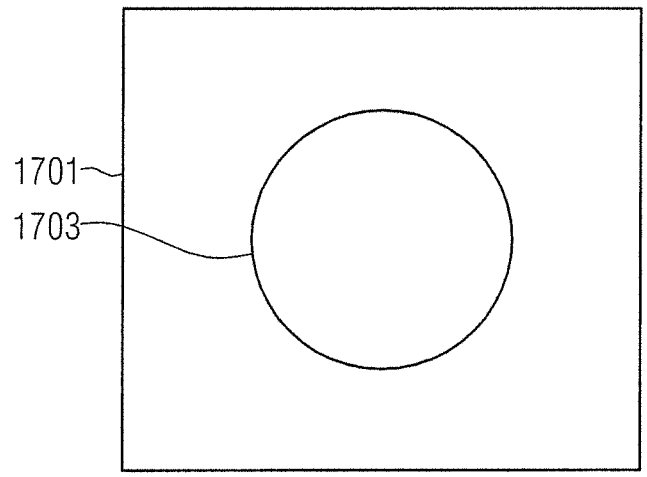
FIG. 17 shows a front view of a lens.

FIG. 17 shows a front view of a lens 1701 formed, for example, as a spherical lens or as an aspherical lens.

The lens 1701 comprises a lens curvature 1703.

Figure 18:
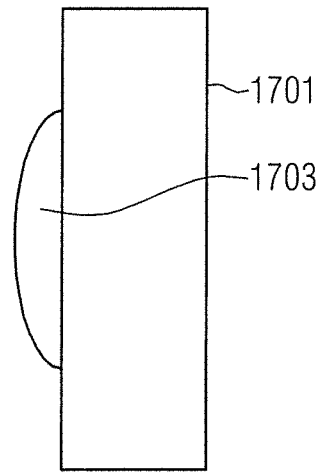
FIG. 18 shows a side view of the lens from FIG. 17.

FIG. 18 shows a side view of the lens 1701 from FIG. 17.

Figure 19:
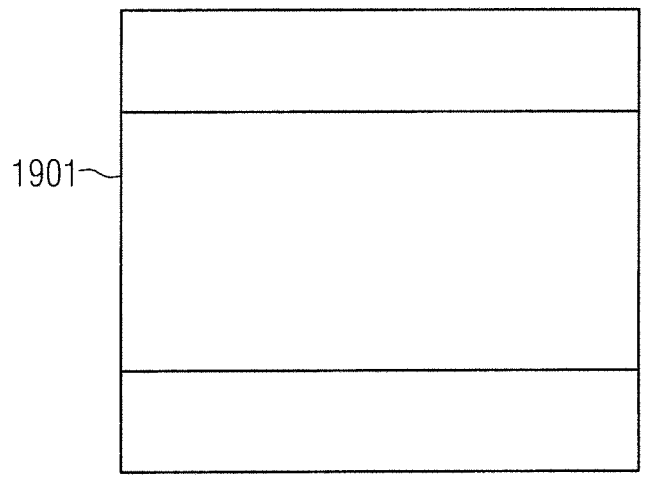
FIG. 19 shows a front view of a cylindrical lens.

FIG. 19 shows a front view of the cylindrical lens 1901 configured to collimate laser radiation polarized along the fast axis.

Figure 20:
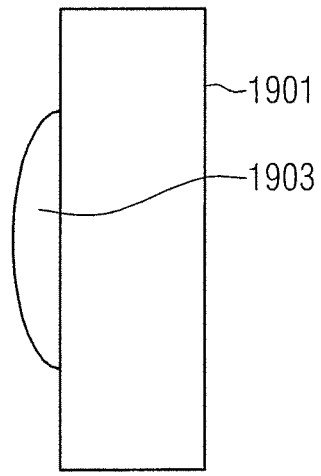
FIG. 20 shows a side view of the lens from FIG. 19.

FIG. 20 shows a side view of the cylindrical lens 1901 from FIG. 19. A lens curvature 1903 of the lens 1901 is visible in the side view.

Figure 21:
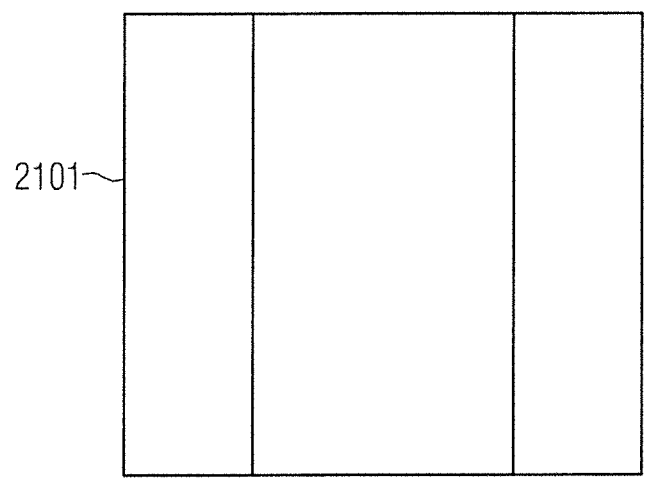
FIG. 21 shows a front view of a further cylindrical lens.

FIG. 21 shows a front view of a further cylindrical lens 2101. The cylindrical lens 2101 is configured to collimate the laser radiation polarized along the slow axis.

Figure 22:
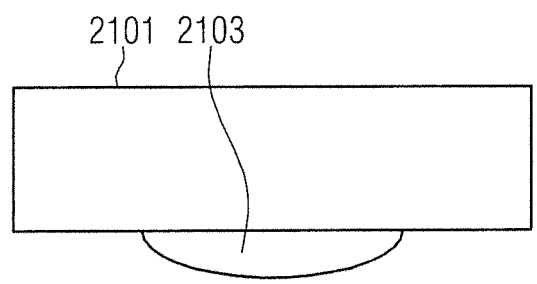
FIG. 22 shows a plan view of the cylindrical lens from FIG. 21.

FIG. 22 shows a plan view of the cylindrical lens 2101 from FIG. 21. A lens curvature 2103 of the cylindrical lens 2101 is visible in the plan view.

To summarize, we provide an efficient technical concept which enables efficient coupling-out of laser radiation from an edge emitting laser chip. The basic concept may be seen in particular in the fact that, for example, a glass window divided in two (glass sheet on both sides of a carrier, which is arranged at a distance from the laser facet and which may therefore also be referred to as a spacer) is placed between two laser facets situated opposite one another. The glass window divided in two is placed, for example, into the later sawing street in front of the laser facets. Preferably, in this case, a window divided in two is positioned between two edge emitting laser chips, wherein the laser facets are directed toward one another. The carrier is preferably sawn apart during the process of singulating the molded or potted elements. In this case, however, the glass faces are not damaged during the sawing process and still comprise an optical quality.

The carrier is formed from a soluble material, for example, which is removed after the molded components have been singulated. By way of example, the soluble material is a water-soluble PVA resist or a water-soluble SU8 resist. Consequently, by way of example, only one optical sheet per individual component then remains.

The carrier is formed from an adhesive film, for example, which is removed after the components have been singulated.

The carrier is formed, for example, from a perforated solid material (for example, a tube comprising a glass cover at the front and rear sides), which is sawn apart during singulating. An optical sheet comprising a frame of the material remains at the individual component.

After placing the glass window divided in two (wherein placing may comprise, for example, dispensing a silicone or adhesive drop with subsequent positioning of the window and curing), according to one example, a silicone drop is introduced between laser facet and glass to form or produce an optical connection between laser facet and glass. This therefore takes place without an additional jump in refractive index as a result of an air gap or absorption of the optical power in a nontransparent material. Afterward, according to one example, the rest of the package is encapsulated by molding with a nontransparent plastic.

If a transparent mold material (generally transparent potting material or optical potting material) is used, according to one example, dispensing additionally places the silicone drop between laser facet and glass window.

The technical advantages arising from the technical concept may be seen in particular in the fact that a very expedient, but powerful laser package may be produced.

The production process is technically simple.

In particular, coupling-out with very high optical quality is thus brought about.

In particular, there is thus the possibility of using coated surfaces in the window. That is to say that, according to one example, the first and/or respectively second optical element is provided with a surface coating.

In particular, very efficient coupling-out is brought about since no air gap is present.

Particularly if a black potting material is used, there is a very good mechanical stability and, by way of example, a visually opaque package is formed.

The potting material is an epoxy, for example.

Consequently, a simple SMT component comprising an edge emitting laser chip is advantageously provided. SMT stands for "Surface Mounted Technology."

Furthermore, the use of the optical element, in particular the use of the window, increases a path length for moisture from outside the package (lighting device) to the laser facet of the laser chip.

Although our devices and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 101 942.9, the subject matter of which is incorporated herein by reference.

The invention claimed is:

1. A method of producing an optoelectronic lighting device comprising:
providing a laser chip carrier on which two edge emitting laser chips each comprising a laser facet are arranged with their respective laser facet opposite one another,
arranging a carrier comprising two optical elements situated opposite one another onto the laser chip carrier between the two laser facets such that after the arranging respectively one of the two optical elements faces one of the two laser facets, forming a respective optical connection by an optical material between a respective laser facet and a respective optical element, singulating the two laser chips by dividing the laser chip carrier between the two laser chips to form two mutually divided laser chip carrier parts, wherein the dividing comprises dividing the carrier between the two optical elements to form two mutually divided carrier parts each comprising one of the two optical elements, such that two singulated laser chips arranged on the respective divided laser chip carrier part are formed, the respective laser facets of which are optically connected to the respective optical element of the respective carrier part by the optical material.

2. The method according to claim 1, wherein the carrier is removed after the singulating.

3. The method according to claim 2, wherein the carrier is formed from a soluble material, and the removing comprises dissolving the material.

4. The method according to claim 1, wherein the carrier is formed as a frame enclosing an opening, and the two optical elements are each arranged on the carrier in a manner covering the opening.

5. The method according to claim 1, wherein, to form the respective optical connection, the two laser chips and the carrier with the two optical elements are potted by an optical potting material such that the respective optical connection is formed by the optical potting material as optical material.

6. The method according to claim 1, wherein after forming the optical connection and before singulating the two laser chips, the two laser chips, the carrier with the two optical elements and the respective optical connections are potted by a potting material.

7. The method according to claim 1, wherein arranging the carrier onto the laser chip carrier comprises adhesively bonding the carrier onto the laser chip carrier by an adhesive.

8. The method according to claim 1, wherein the two optical elements are each an element selected from the group consisting of spherical lens, aspherical lens, collimator lens, and cylindrical lens, that collimate a laser radiation emitted by the laser chip and which is polarized in a direction of a fast axis of the laser chip or in a direction of a slow axis of the laser chip.

9. The method according to claim 8, wherein the carrier comprises two curvatures that respectively accommodate a lens curvature of the respective lens.

\* \* \* \* \*